United States Patent
Abraham

(10) Patent No.: US 6,891,609 B2
(45) Date of Patent: May 10, 2005

(54) MEASUREMENT BOX WITH MODULE FOR MEASURING WAFER CHARACTERISTICS

(75) Inventor: Michael Abraham, Mainz (DE)

(73) Assignee: Nanophotonics AG, Mainz (DE)

( * ) Notice: Subject to any disclaimer, the term of this patent is extended or adjusted under 35 U.S.C. 154(b) by 55 days.

(21) Appl. No.: 10/120,639

(22) Filed: Apr. 11, 2002

(65) Prior Publication Data

US 2003/0193671 A1 Oct. 16, 2003

(51) Int. Cl.$^7$ ............................................. G01N 21/00
(52) U.S. Cl. ............................. 356/237.1; 356/237.5; 427/8
(58) Field of Search .................. 356/244, 246, 356/237.1–237.5, 630–632, 364–369, 394; 427/8, 10, 248.1, 559.27, 559.4, 559.42; 250/559.27, 559.4, 559.42

(56) References Cited

U.S. PATENT DOCUMENTS

| | | | |
|---|---|---|---|
| 5,502,567 A | 3/1996 | Pokrowsky et al. | |
| 5,872,632 A | * 2/1999 | Moore | 356/630 |
| 5,897,710 A | * 4/1999 | Sato et al. | 427/8 |
| 6,091,499 A | 7/2000 | Abraham et al. | |
| 6,157,450 A | * 12/2000 | Marchese-Ragona et al. | 356/602 |

FOREIGN PATENT DOCUMENTS

JP 05-259259 * 10/1993

* cited by examiner

Primary Examiner—Hoa Q. Pham
(74) Attorney, Agent, or Firm—Hudak, Shunk & Farine Co. L.P.A.

(57) ABSTRACT

A measurement box which can be integrated into existing wafer processing equipment. The measurement box comprises an enclosure which contains a measurement module for measuring objects such as the surfaces of wafers. The measurement module is equipped with a miniaturized measuring device and has a displaceable measuring head and a plane table with a rotatable wafer holder. The enclosure has at least one loading opening for the wafer to pass through as well as a ventilation device.

12 Claims, 3 Drawing Sheets

MEASUREMENT BOX WITH MODULE FOR MEASURING WAFER CHARACTERISTICS

FIELD OF THE INVENTION

The invention relates to a measurement box for wafer processing equipment.

BACKGROUND OF THE INVENTION

For quality control in the manufacture of semiconductor chips, particularly the manufacture of wafers with a diameter of 300 mm, integrated measurement techniques are increasingly used. In integrated measurement techniques, unlike in conventional stand-alone methods, the measuring device is directly connected to, and integrated in, the production equipment. This is to ensure that quality control is as close as possible to the process.

The integration of measurement techniques in the processing equipment is often highly complex, as it frequently requires modifications in both systems, i.e. in the processing equipment and in the measurement system, which in turn is connected with additional costs.

In 300 mm wafer technology, however, a high degree of standardization is found. The processing equipment is provided with so-called Equipment Front End Modules (EFEMs). The EFEM represents the interface between the chip factory and the processing tool and takes care of logistics, i.e. the automatic supply of the equipment with wafers. The EFEMs typically have at least two load ports, the dimensions of which are standardized. The wafer containers (Front Opening Unified Pods or FOUPs), which hold the wafers, are placed onto these load ports.

The EFEM further comprises a robot and at the back is coupled to the corresponding processing equipment. The EFEM comprises a wafer container (FOUP), transports the wafer by means of a further robot into the processing tool via a lock, and after processing delivers the wafer to another FOUP.

In principle, an EFEM can also have several load ports. The load ports can be readily interchanged. The EFEM is thus an ideal location for coupling a measurement device to processing equipment, since it enables the use of the existing logistics of the EFEM with robots to allow flexible integration of the measuring process in the production process.

Integrated measurement techniques make it possible to subject the wafer to input measurement prior to processing and final inspection after processing. This makes it possible to avoid further processing of bad wafers and to return the equipment to the defined process windows if divergent parameters are detected.

A prerequisite for mounting the measurement module to the EFEM instead of a load port, however, is that the measuring equipment is no wider or deeper than a load port and thus meets the standardized dimensions defined in SEMI Standard E 15.

SUMMARY OF THE INVENTION

The object of the invention is to provide a measurement box that can be integrated into existing wafer processing equipment.

This object is attained by a measurement box with an enclosure, which contains a measurement module for measuring particularly the surfaces of wafers. The measurement module is equipped with a miniaturized measuring device and has a displaceable measuring head and a plane table with a rotatable wafer holder. The enclosure has at least one loading opening for the wafer to pass through as well as a ventilation device.

The measuring device integrated in the measuring head can, for instance, be a spectrometer for measuring film thickness and film compositions, an FTIR (Fourier Transform Infrared) spectrometer for measuring impurities, an ellipsometer for measuring film thickness, a microscope for measuring lateral structures as well as defects, a scattered light measuring device for measuring particles or other defects, or an atomic force microscope. A miniaturized measuring device is defined as a device whose space requirement is $\leq 150 \cdot 300$ mm. Such measuring devices are known, for instance, from U.S. Pat. No. 5,502,567 and U.S. Pat. No. 6,091,499.

The loading opening is used to deliver the wafers to the measuring device and to remove them again after measurement is completed. Since the pressure in the processing tool to which the measurement module is coupled is positive, air, due to the pressure difference, flows out of the processing tool through the loading opening into the measurement box. To ensure a continuous flow within the measurement box, a corresponding ventilation device is provided. The loading opening and the ventilation device are preferably adjusted to one another so as to ensure airflow within the measurement box. This prevents on the one hand impurities from penetrating into the measurement box from the outside and on the other hand eddies from forming within the measurement box, which might affect the measurement.

The measurement box is compact and can be mounted in a wafer production system wherever the measurement box can be loaded with wafers and the measurement of wafers is meaningful.

The base area of the enclosure is preferably $\leq 350$ mm$\times \leq 400$ mm. Since the dimensions of the measuring head are preferably less than 150·300 mm and the wafer is rotated during measurement while the measuring head is simultaneously displaced by means of a linear motion, the space required for measuring the wafer is so small that the base area of the measurement box can be limited to 350·400 mm or less. Thus, it is also excellently suited for use in wafer production plants in the locations where the load ports are provided. This has the advantage that no modifications need to be made in the wafer processing equipment, either on the processing tool or the EFEM. This achieves a high measure of integrity and compatibility.

The loading opening can preferably be sealed. If required, for instance, the measurement box can be sealed with a standard door of a 300-mm cassette. To this end, the interface plate is configured to be compatible with a FOUP door in accordance with SEMI Standard 47.1. This enables the handling systems of, for instance, a 300 mm processing plant to open the door in the coupled measurement box from the inside, i.e. from the side of the processing equipment, to introduce the wafers, and if necessary to close it. This gives the user the option hermetically to separate the measuring space from the measuring device.

To further enhance the adaptation to the characteristics of a wafer processing tool, the loading opening is preferably arranged in an interface plate, which forms a sidewall of the enclosure and which has means for coupling with a wafer processing tool as well as ports for connection with the media of the wafer processing tool. These ports are preferably electrical ports, ports for compressed air, vacuum ports, and ports for a computer interface. The interface plate is preferably configured to meet SEMI Standard E 63.

A further option is to configure the interface plate such that it conforms to a coupling surface of a FOUP. In this case, SEMI Standard E 62 regarding a FOUP connection must be met.

The ventilation opening is preferably arranged in the enclosure wall opposite the loading opening. This facilitates the formation of a flow of air within the measurement box.

The loading opening is preferably a horizontal slot.

Advantageously, the ventilation device is a ventilation grille arranged in a sidewall. According to another embodiment, the ventilation device can also have at least one adjustable pressure relief valve.

BRIEF DESCRIPTION OF THE DRAWINGS

Exemplary embodiments of the invention will now be described in greater detail with reference to the drawings in which.

DETAILED DESCRIPTION OF THE INVENTION

Figure 1:
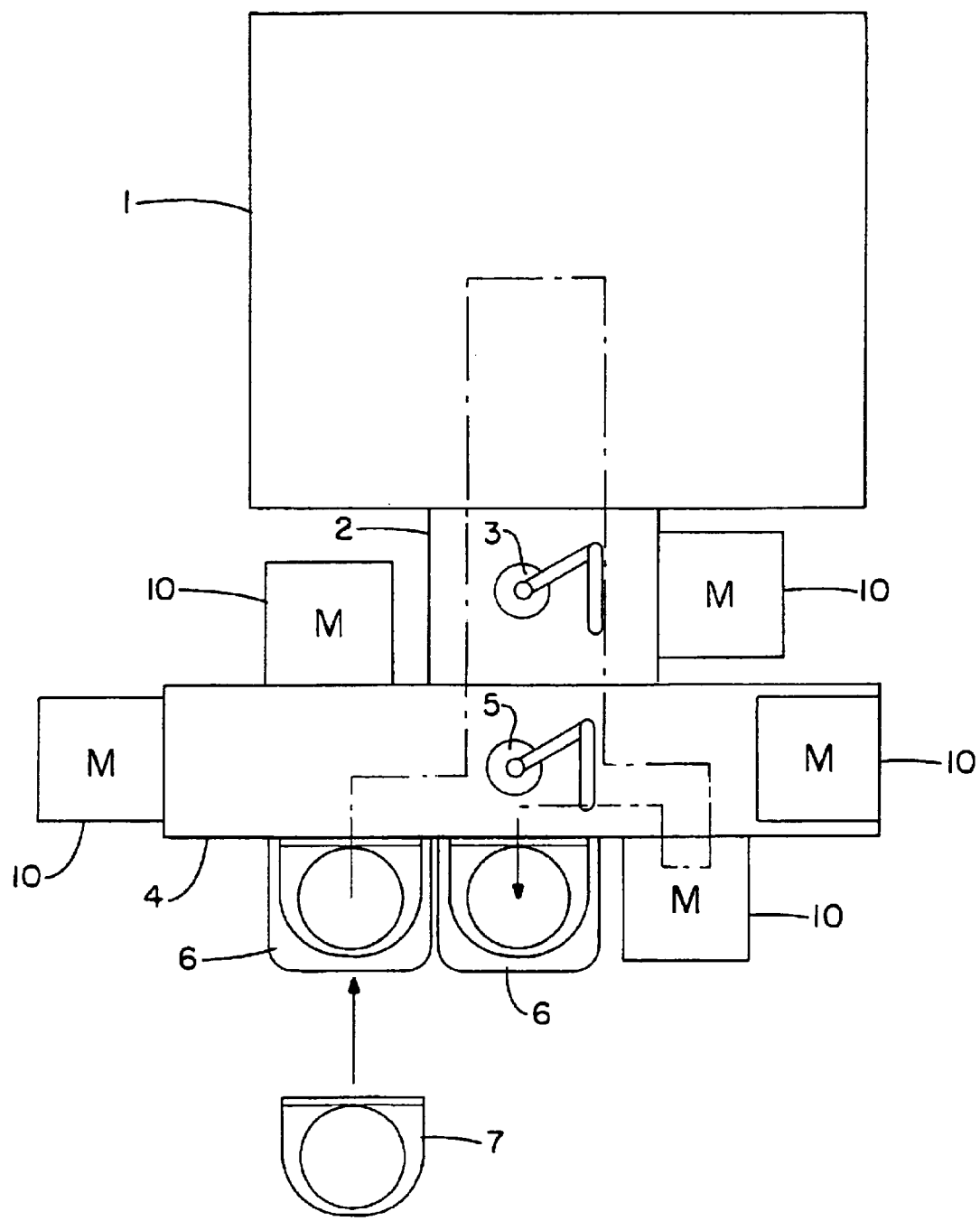
FIG. 1 is a schematic representation of a wafer processing tool.

FIG. 1 schematically depicts a wafer processing unit. A vacuum lock with a lock robot 3 arranged therein is connected upstream from processing tool 1 in which the wafers are processed. Said lock robot 3 transports the wafers from an EFEM 4 into the processing tool 1. The EFEM is equipped with load ports 6 on which wafer containers 7 are positioned. Furthermore, an EFEM robot 5 is arranged in the EFEM. The measurement box 10 according to the invention can be arranged at different locations, which in FIG. 1 are identified as M. The measurement box 10 can, for instance, be arranged in vacuum lock 2 or on the sidewalls of EFEM 4, here particularly in the location of load ports 6. Due to its compact dimensions, which are smaller than those of load ports 6, measurement box 10 can be easily mounted wherever wafers need to be measured.

Figure 2:
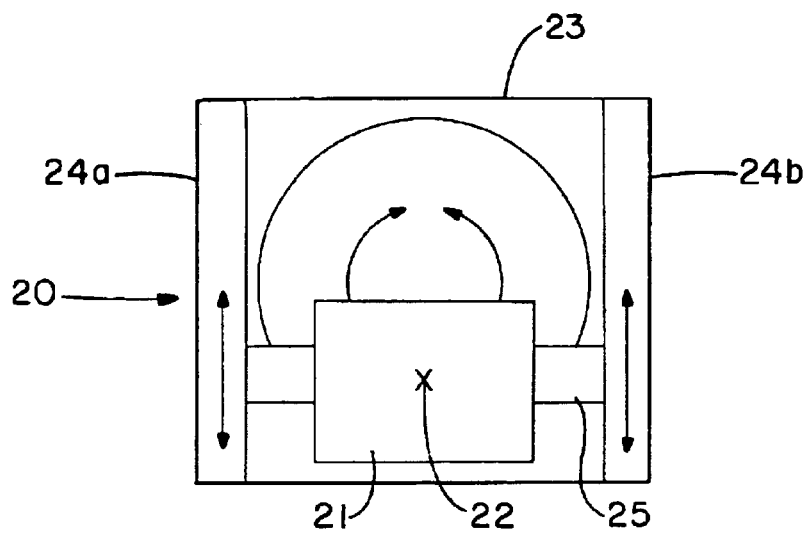
FIG. 2 is a top view of a measurement module.

FIG. 2 is a top view onto a measurement module 20, which is arranged in measurement box 10. This measurement module 20 comprises a plane table 23 with a wafer holder 26, which is equipped with a rotary drive. Adjacent to wafer holder 26 are two linear motors 24a, b, which are connected via a support 25 and carry measuring head 21. A measuring device for measuring, for instance, film thickness on wafer 8, shown in FIG. 3, is arranged within measuring head 21.

The measuring point is identified by the reference numeral 22. During measurement, the wafer holder 26 and thus the wafer rotate. At the same time, the measuring head 21 is displaced in the direction of the arrows by means of linear motors 24a, b. This motion combination is sufficient to displace measuring head 21 over half the diameter of the wafer. This creates a device that is compact overall. All the components required for control and evaluation are accommodated in a separate control and evaluation module 30, which is connected to measurement box 10 via one or more connecting cables 31.

Figure 3:
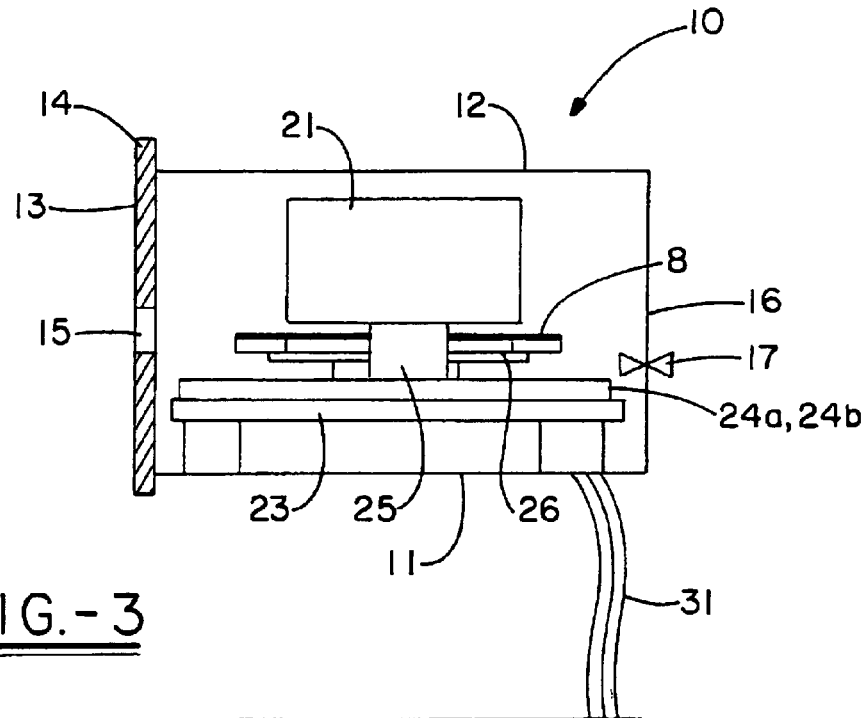
FIG. 3 is a side view of a measurement box with connected control and evaluation unit.
Figure 4:
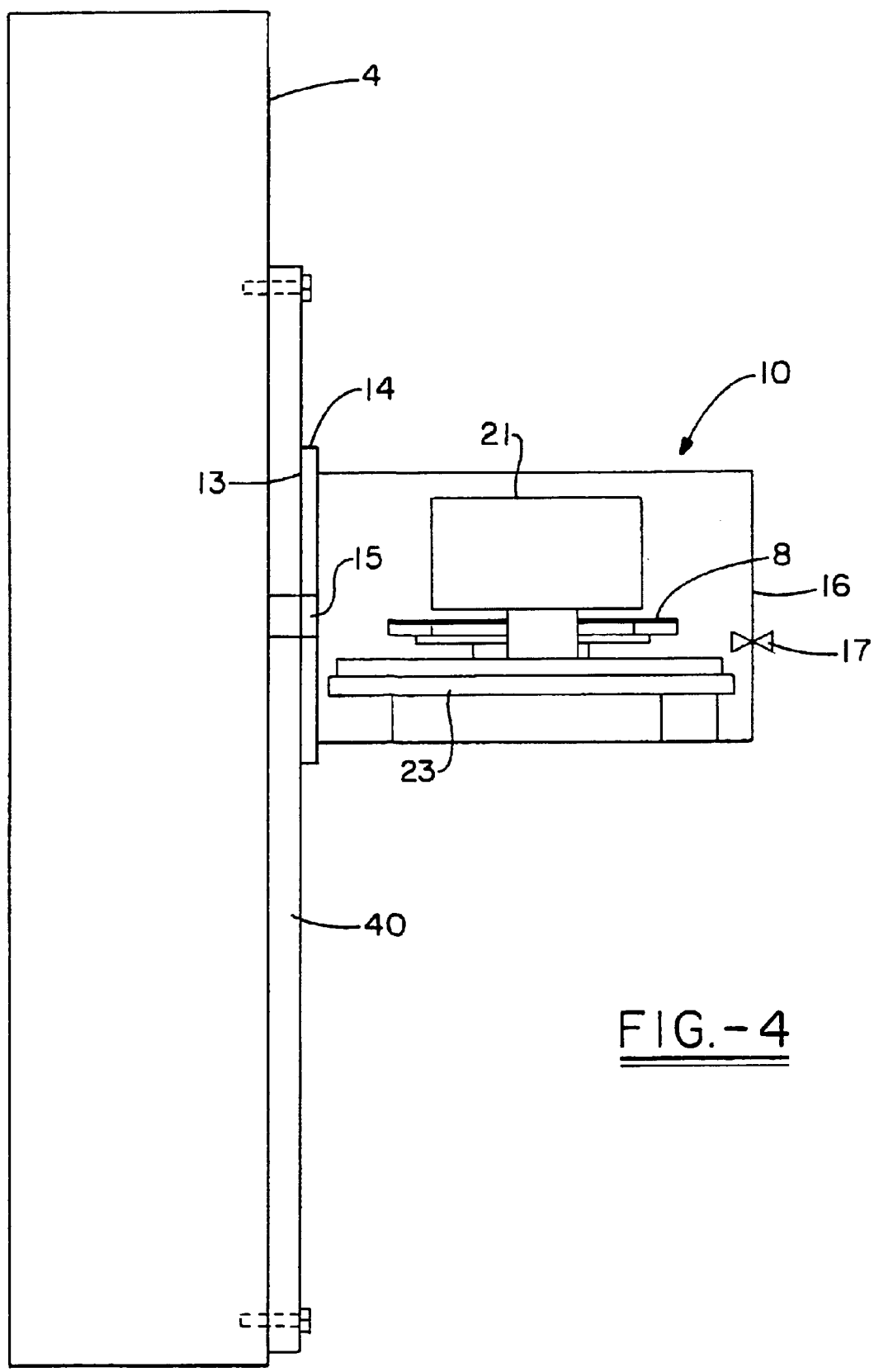
FIG. 4 shows a measurement box connected to an EFEM.

As FIG. 3 furthermore shows, measurement box 10 has a bottom and a top wall 11, 12, a front wall 13 and a rear wall 16. Front wall 13 is formed by an interface plate 14 in which a loading opening 15 is made. Interface plate 14 has corresponding ports (not depicted) and creates the connection to a component of the wafer processing tool as illustrated in FIG. 4. Interface plate 14 is connected to a connection plate 40 of an EFEM 4. Interface plate 14 is configured in such a way that the fastening and connection devices of the EFEM or connection plate 40 can be used.

In FIGS. 3 and 4, an adjustable pressure relief valve 17 is arranged in rear wall 16. The pressure relief valve 17 in rear wall 16 is arranged slightly below wafer 9 and at approximately the same height as the loading opening 15. This allows for a flow of air within measurement box 10.

| List of Reference Numerals | |
| --- | --- |
| 1 | processing tool |
| 2 | lock robot |
| 4 | EFEM |
| 5 | EFEM robot |
| 6 | load port |
| 7 | loading container |
| 8 | wafer |
| 10 | measurement box |
| 11 | bottom wall |
| 12 | top wall |
| 13 | front wall |
| 14 | interface plate |
| 15 | loading opening |
| 17 | pressure relief valve |
| 20 | measurement module |
| 21 | measuring head |
| 22 | measuring point |
| 23 | plane table |
| 24a, b | linear motor |
| 25 | support |
| 26 | wafer holder |
| 30 | control and evaluation module |
| 31 | connecting cable(s) |
| 40 | connecting plate |

What is claimed is:

1. A measurement box comprising: an enclosure in which is arranged a measurement module for measuring particularly the surface of wafers, said measurement module comprising a displaceable measuring head that is equipped with a miniaturized measuring device, said measurement module further comprising a plane table with a rotatable wafer support, wherein the enclosure has at least one loading opening for wafers to pass through, as well as a ventilation device, wherein the ventilation device is a ventilation grille arranged in a sidewall or at least one adjustable pressure relief valve, and wherein pressure in a wafer processing tool to which the measurement module is coupled is positive, and air, due to a pressure difference, flows out of the wafer processing tool through the loading opening into the measurement box and subsequently out through the ventilation device of the measurement box when the loading opening is open.

2. A measurement box according to claim 1, wherein the enclosure has a base which is ≦350 mm×≦400 mm.

3. A measurement box according to claim 2, wherein the loading opening can be closed.

4. A measurement box according to claim 1, wherein the loading opening can be closed.

5. A measurement box according to claim 4, wherein the loading opening is located in an interface plate, which forms a sidewall of the enclosure and has means for connection to the wafer processing tool as well as ports for connection with the media of the wafer processing tool.

6. A measurement box according to claim 1, wherein the loading opening is located in an interface plate, which forms a sidewall of the enclosure and has means for connection to the wafer processing tool as well as ports for connection with the media of the wafer processing tool.

7. A measurement box according to claim 6, wherein the ventilation device is arranged in the enclosure wall opposite the loading opening.

8. A measurement box according to claim 1, wherein the ventilation device is arranged in the enclosure wall opposite the loading opening.

9. A measurement box according to claim 8, wherein the loading opening is a horizontal slot.

10. A measurement box according to claim 1, wherein the loading opening is a horizontal slot.

11. A measurement box according to claim 10, wherein the ventilation device is the ventilation grille arranged in a sidewall.

12. A measurement box according to claim 10, wherein the ventilation device is the at least one adjustable pressure relief valve.

* * * * *